(12) United States Patent
Sawa

(10) Patent No.: US 8,542,065 B2
(45) Date of Patent: Sep. 24, 2013

(54) TRANS-IMPEDANCE AMPLIFIER FOR OPTICAL RECEIVER

(75) Inventor: Takashi Sawa, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 2 days.

(21) Appl. No.: 13/287,174

(22) Filed: Nov. 2, 2011

(65) Prior Publication Data

US 2012/0092073 A1  Apr. 19, 2012

(51) Int. Cl.
*H03F 3/04*  (2006.01)
(52) U.S. Cl.
USPC ............................... 330/288; 330/308
(58) Field of Classification Search
USPC ............... 330/288, 308, 59, 110; 250/214 A, 250/214 AG
See application file for complete search history.

(56) References Cited

U.S. PATENT DOCUMENTS 5,606,277 A * 2/1997 Feliz .............................. 327/311

FOREIGN PATENT DOCUMENTS

JP  2000-174564  6/2000

* cited by examiner

*Primary Examiner* — Hieu Nguyen
(74) *Attorney, Agent, or Firm* — Smith, Gambrell & Russell, LLP

(57) ABSTRACT

A trans-impedance amplifier (TIA) for an optical receiver is disclosed, where the TIA stabilizes the cross point in the output thereof independent of the variation of the power supply. The TIA of the invention includes an amplifier section, a source follower, and a bias generator. A transistor in the source follower to define the current flowing in the source follower and another transistor in the bias generator constitute a current-mirror circuit. The operating point of the other transistor in the bias generator depends on the variation of the power supply. The output level of the amplifier section follows the variation of the power supply.

3 Claims, 8 Drawing Sheets

TRANS-IMPEDANCE AMPLIFIER FOR OPTICAL RECEIVER

BACKGROUND OF THE INVENTION

1. Field of the Invention

The present invention relates to a trans-impedance amplifier (hereafter denoted as TIA), in particular, the invention relates to a trans-impedance amplifier used in an optical receiver.

2. Related Background Art

A Japanese Patent Application published as JP-2000-174564A has disclosed a pre-amplifier that which may convert a faint photocurrent received from an optical receiving device into a voltage signal. The pre-amplifier disclosed therein includes a series circuit of an FET, a cascade FET, and a load resistor as an input stage, and outputs a drain signal of the cascade FET through a source follower. The pre-amplifier further provides a function to detect a portion of the photocurrent by the current-mirror circuit, and superposes a voltage signal converted by this current-mirror circuit on the output of the pre-amplifier. The current source in the source follower, however, is constituted by an FET whose gate is short-circuited to the source thereof.

Recent optical communication system for the long distance generally implements an optical amplifier; accordingly, the optical receiver installed in such a system is required to receive an optical signal with a large optical to signal noise ratio (OSNR). An optical noise generated during ON period becomes far greater than the noise during OFF period. FIG. 8A schematically shows atypical eye-diagram coming into the optical receiver. The optical signal, which is amplified by the optical amplifier put in the optical transmission path, accompanies with a noise N as shown in FIG. 8A. The magnitude A1 of the noise N sometimes becomes comparable to a half of the magnitude A2 of the optical signal during ON period. Even the optical transmission path excludes any optical amplifiers, the magnitude A1 of the noise becomes far greater in ON period than that A2 of OFF period. The noise in OFF period is due to electrical elements implemented in the downstream of the PD.

The PD converts the optical signal containing large noise N, the pre-amplifier converts the photocurrent to the voltage signal; finally, a linear amplifier amplifies the converted voltage signal. Because the accumulative gain of the pre-amplifier and the linear amplifier sometimes exceeds 40 dB, which becomes hard to compensate a drift of DC operating conditions, the AC coupling is put between the pre-amplifier and the liner amplifier. When the cross point of the linear amplifier is set to be 0 mV, the noise N during ON period remarkably appears in the output of the linear amplifier.

To suppress the influence of the noise N, one technique has been well known, in which the input threshold of the linear amplifier is negatively shifted below 0 mV, namely to the OFF state of the optical signal. Such a technique may effectively suppress the magnitude A1 of the noise N; but, when this mechanism is to be applied to the linear amplifier, an additional circuit is necessary to control the input threshold of the linear amplifier, which is often called as an offset controller. Generally, the offset controller has a relatively complex arrangement. Accordingly, a conventional optical receiver shifts the cross point thereof to a level half of the amplitude A2 of the optical signal to enhance the OSNR.

One technique to shift the cross point of the TIA has been known where the gain or the trans-impedance is varied depending on the magnitude of the photocurrent input therein because the photocurrent becomes large in ON state of the optical signal, that is, the TIA has the non-linear gain or the non-linear trans-impedance. Shifting the cross point of the TIA over 50% of the magnitude A2 of the optical signal to reduce the gain/trans-impedance during ON state, the noise distribution of the HIGH level, which extends to a center portion of the eye diagram, may be compressed and close to the HIGH level and the noise distribution in the center portion may be vanished, as shown in FIG. 8A. Moreover, this technique may maintain the cross point in substantially center of the eye diagram, namely, close to 0 mV. Thus, the variable gain/trans-impedance technique may stably recover the data contained in noisy optical signal without controlling the offset of the linear amplifier.

However, the technique above described has an inherent subject that the shift amount in the cross point thereof depends on variation of the power supply voltage. The present invention is to provide a solution for this subject, that is, the shift amount may be substantially independent of the variation of the power supply voltage.

SUMMARY OF THE INVENTION

A trans-impedance amplifier according to a present invention comprises an amplifier section, a source follower, and a bias generator. The source follower receives an output of the amplifier section and includes a first transistor to define a current flowing in the source follower. The bias generator includes a second transistor and a load resistor. The second transistor is arranged in a diode connection, namely, whose control electrode is directly connected to one of current electrodes thereof and another current electrode is grounded. The load resistor is connected in series to the second transistor between a power supply and a ground. A feature of the present invention is that the first transistor in the source follower and the second transistor in the bias generator constitute a current mirror circuit to determine the current flowing in the source follower.

In the TIA of the present invention thus arranged, the output of the amplifier section varies in a level thereof depending on the variation of the power supply, because the current flowing in the source follower is determined by the current mirror circuit whose control current flowing in the bias generator depends on the variation of the power supply. Thus, the output of the amplifier section, which is extracted to the outside of the TIA, varies as the power supply varies.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS

Next, some preferred embodiments of a TIA applicable to the optical receiver will be described. In the description of the drawings, the same numerals or the same symbols will refer to the same elements without overlapping explanations.

Figure 1:
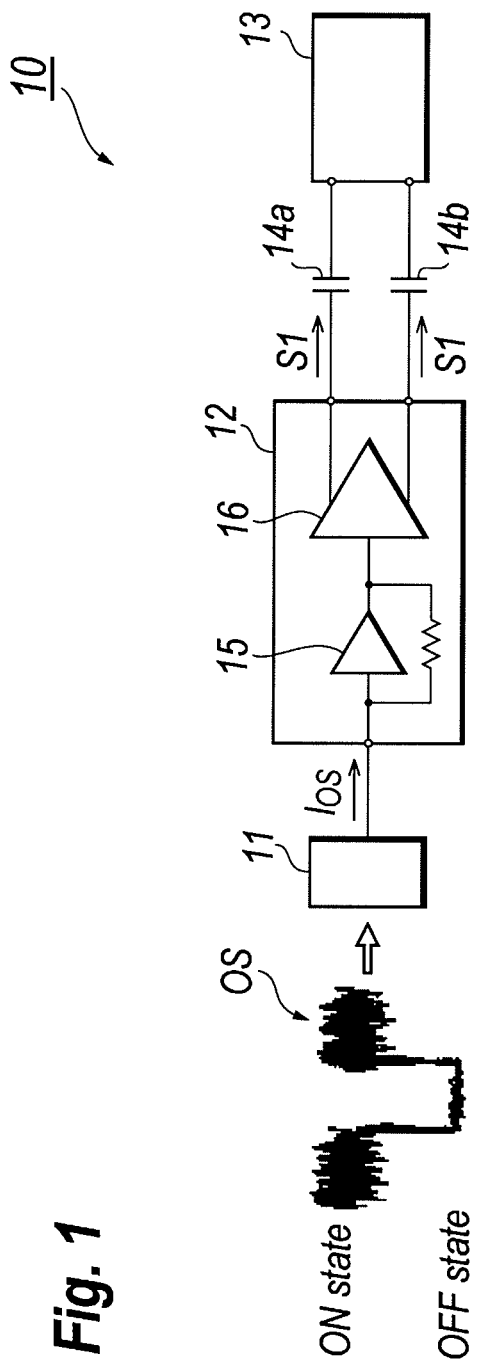
FIG. 1 schematically illustrates an optical receiver implementing a TIA according to an embodiment of the present invention.

FIG. 1 is a schematic block diagram of an optical receiver that installs a preamplifier according to one embodiment of the present invention. The optical receiver 10 includes a PD 11, a preamplifier 12, and a limiting amplifier 13. The PD 11 receives an optical signal OS and generates a photocurrent $I_{OS}$ corresponding to the optical signal OS. Because the optical signal OS is modulated by a high frequency, the photocurrent $I_{OS}$ is also modulated by the high frequency. The photocurrent $I_{OS}$ is provided to the preamplifier 12. The PD 11 is reversely biased in the present embodiment; the PD 11 is coupled in the anode thereof with the preamplifier 12.

The preamplifier 12 converts the photocurrent $I_{OS}$ into a voltage signal S1, which is also modulated by the high frequency and has an arrangement of, what is called, the differential signal. The preamplifier 12 includes a TIA 15 and a differential amplifier 16. The TIA 15 converts the photocurrent $I_{OS}$ into the voltage signal, which is the single ended signal. Meanwhile, the differential amplifier 16 converts the single ended signal to the differential signal S1. Two outputs of the differential amplifier 16 are coupled with the limiting amplifier 13 in the AC mode through the coupling capacitors, 14a and 14b. The limiting amplifier 13 amplifies the signal S1 and outputs thus amplified signal to the external.

Figure 2:
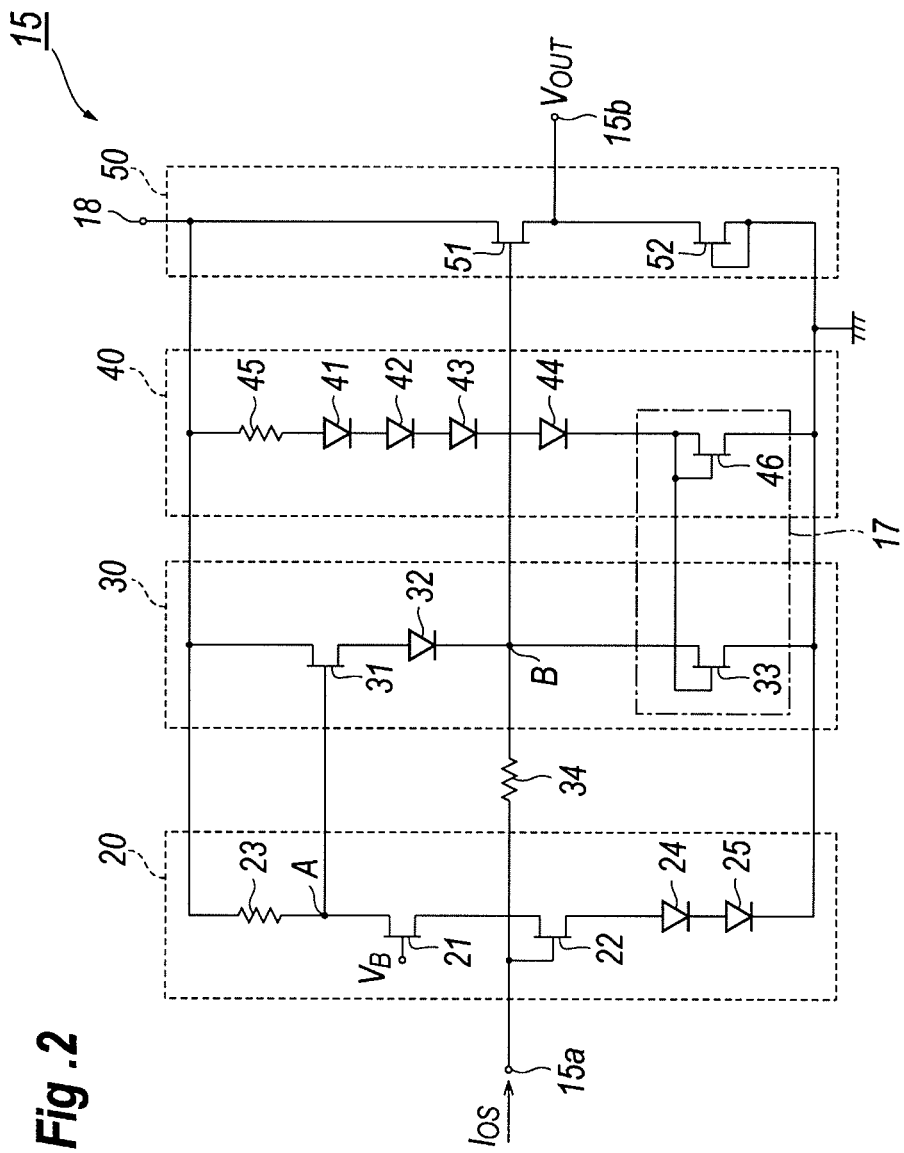
FIG. 2 is a circuit diagram of the TIA according to an embodiment of the invention.

FIG. 2 shows a circuit diagram of the TIA 15. The TIA of the present embodiment includes an input terminal 15a, an output terminal 15b, an amplifier 20, a source follower 30, a bias generator 40 and an output buffer 50. The input terminal 15a receives the photocurrent IOS, while, the output terminal 15b outputs the voltage signal $V_{OUT}$ to the differential amplifier 16.

The amplifier 20 has, what is called, the arrangement of the source grounded configuration where two transistors, 21 and 22, are connected in cascade. Specifically, one of transistors 21 in the source thereof is connected to the other of the transistors 22 in the drain thereof. The former transistor 21 is biased by the power supply through the load resistor 23, while, the latter transistor is grounded in the source thereof through two diodes, 24 and 25, connected in series to the others. The gate of the upper transistor 21 receives the DC bias $V_B$, while, that of the lower transistor 22 is connected to the input terminal 15a.

The source follower 30 includes two transistors, 31 and 33, and a diode 32, where they are connected in series to each other between the power supply 18 and the ground. The upper transistor 31 operates as the source follower by receiving the output of the cascade transistor 21, namely the node A, while, the lower transistor 33 shows a function of a constant current source as the first transistor. The diode 32 lowers the voltage level of the source of the upper transistor 31; that is, the cathode of the diode 32, namely the node B, is coupled with the output terminal 15b through the output buffer 50 and the input terminal 15a through the trans-impedance 34.

The bias generator 40 generates a bias to drive the transistor 33 of the current source. The bias generator 40 includes a resistor 45, a plurality of diodes, 41 to 44, and a transistor 46, where they are connected in series between the bias supply 18 and the ground. The transistor 46 has the diode connection, that is, the base thereof as the control electrode is short-circuited to the drain thereof and connected to the cathode of the lowest diode as one of current electrodes. The FET 46 of bias generator 40 thus configured constitutes a current mirror circuit cooperating with the FET 33 of the source follower 30. That is, because the gate of the current source transistor 33 is connected to the gate of the transistor 46 of the bias generator 40, and the gate level of the transistor 46 may be determined by the series circuit in the bias generator. Then, the level of the source follower 30 may be automatically determined by the bias generator 40. The equivalent resistance of the transistor 46 is preferable to be equal to that of the resistor 45. That is, the voltage drop between the drain and the source of the transistor 46 is preferably equal to the voltage drop by the resistor 45.

The output buffer 50 has the arrangement of the source follower; specifically, the output buffer 50 has two transistors, 51 and 52, connected in series between the power supply 18 and the ground. The upper transistor 51 has the arrangement of the source follower, that is, the gate of the transistor 51 is connected to the node B to receive the output of the source follower 30; while, and the source thereof is connected to the output terminal 15b. The other transistor 52 has the arrangement of the current source to determine the current flowing in the upper transistor 51.

The operation of a comparable TIA 15 will be described as referring to FIG. 3. The circuit diagram of the TIA 100 shown in FIG. 3 includes the amplifier section 120, a source follower section 130, and an output buffer section 150, but excludes the bias generator 40 shown in FIG. 2. A distinguishable point of the amplifier section 120 compared with that 20 shown in FIG. 2 is that the section 120 further provides a current source 121. Thus, current source is a type of the constant current source connected in parallel to the load resistor 23 and the cascade FET 21. Moreover, the current source 33 in the source follower section 130 does not constitute the current mirror circuit as that shown in FIG. 2. The gate of the FET 33 is short-circuited to the ground to constitute the constant current source. The output buffer 150 has the same arrangement with those shown in FIG. 2.

The TIA 100 in FIG. 2 stably sets the voltage level of the nodes, A and B, at no input voltage because the gate of the FET 22 is coupled with the output node B through the trans-impedance 34, which constitutes the negative feedback path. Inputting the photocurrent $I_{OS}$ in the input terminal 15a, almost all of the photocurrent $I_{OS}$ flows in the trans-impedance 34 because the input impedance of the FET 22 is enough large. The photocurrent $I_{OS}$ flowing in the trans-impedance 34 causes a voltage drop, which directly appears in the node B and the output terminal 15b; accordingly, the photocurrent $I_{OS}$ may be converted to a voltage signal.

The output voltage $V_{OUT}$ appeared in the terminal 15b shows a phase opposite to that of the photocurrent $I_{OS}$. That is, increasing the photocurrent $I_{OS}$, the level of the output voltage $V_{OUT}$ lowers. Thus, the TIA 100 operates as an inverting amplifier. Increasing the optical power during the emission, not only the level of the output voltage $V_{OUT}$ lowers but that of the node A also lowers. However, the cascade FET 21 may restrict the decrease of the level at the node A, which causes the amplifier section 120 to be biased in the saturation region. Such a status of the amplifier section 120 is equivalent to a condition where the gain of the amplifier section 120 decreases because the optical input in ON period is suppressed. Then, the cross point shifts more than 50% in ON state, which may enhance the OSNR of the optical receiver.

Figure 3:
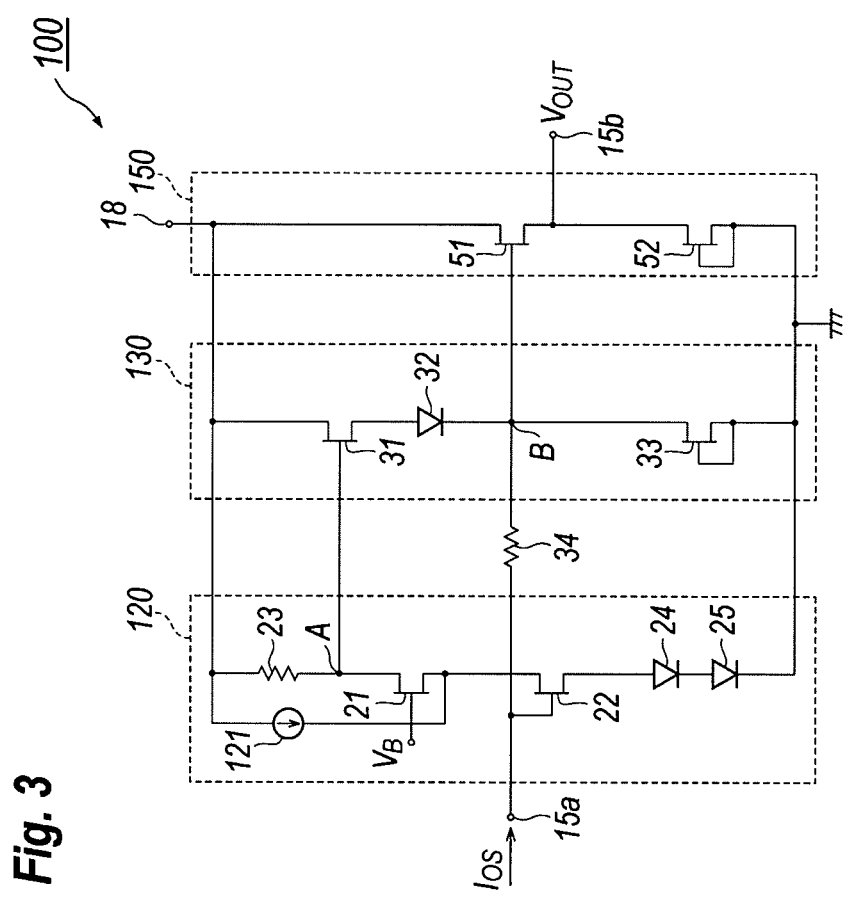
FIG. 3 is a circuit diagram of a TIA according to a comparable embodiment.

The TIA 100 shown in FIG. 3 has inherent subjects; that is, the fluctuation of the power supply 18 is not reflected in the fluctuation of the level at node A, which may fluctuate the cross point depending on the fluctuation of the power supply 18. Specifically, assuming an arrangement of no current source 121 in the amplifier section 120, the level at the node A, which is denoted as $V_A$, is solely determined by the voltage drop at the trans-impedance 34 by the photocurrent $I_{OS}$. As the photocurrent $I_{OS}$ increases, the output $V_{OUT}$ lowers because the voltage drop at the trans-impedance 34 increases. While, because the FET 33 is the constant current source by connecting the gate thereof directly to the source, $V_{GS}=0$, a constant current flows in the FETs, 31 and 33, where the constant current may be given by: $K_F \times (V_{GS} - V_{TH})^2$, where $K_F$ corresponds to the trans-conductance Gm and $V_{TH}$ is the threshold voltage of the FET, respectively. The FET 31 is biased between the base and source thereof $V_{GS}$ such that the current flowing therein becomes the current determined by the other FET 33. Accordingly, the level $V_A$ may be given by the output level $V_{OUT}$ added by the bias $V_{GS}$ of the FET 31, which becomes constant independent of the power supply. Thus, increasing the power supply 18, the voltage drop at the load resistor 23 becomes large because the level $V_A$ is set substantially constant as described above. The gate bias of the FET 22 is forced to increase in order to compensate the voltage drop at the load resistor 23 without the current source 121.

The current set by the current source 121 is greater by about one digit than the current flowing in the load resistor 23 when the optical receiver 100 receives no optical signal. That is, the gate bias $V_{GS}$ of the FET 22 may be primarily determined by the current determined by the current source. The variation of the level $V_A$ caused by the swing of the input photocurrent $I_{OS}$ may be substantially ignorable. This automatically means that, even the power supply 18 fluctuates and the voltage drop at the load resistor 23 varies, the level $V_A$ may be still determined by and maintain at the sum of the output level $V_{OUT}$ and the gate bias $V_{GS}$ of the FET 31.

Figure 4:
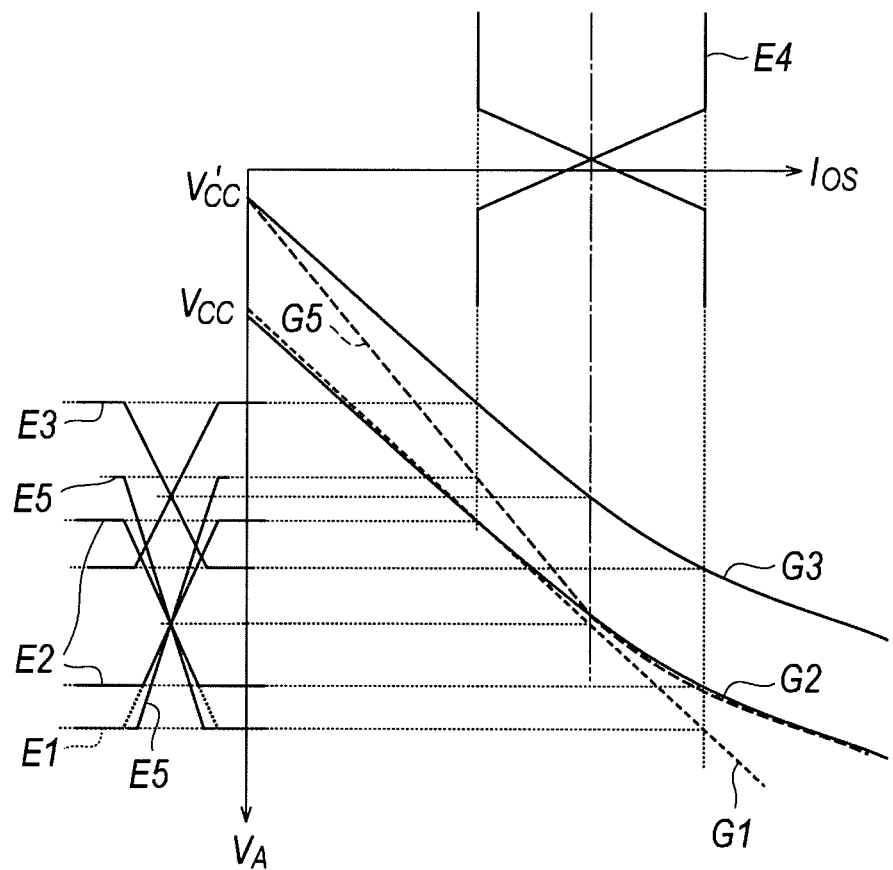
FIG. 4 schematically illustrates the operation of the TIA of the present embodiment and that of the comparable embodiment.

FIG. 4 schematically explains the mechanism described above. In FIG. 4, the vertical axis corresponds to the level $V_A$, while, the horizontal axis corresponds to the magnitude of the photocurrent $I_{OS}$. The input photocurrent $I_{OS}$ has an eye diagram of E4 with the cross point of 50%. Behaviors, E1 to E3, are eye diagrams at the node A each obtained through transfer curves, G1 to G3, when the photocurrent $I_{OS}$ with the eye diagram E4 enters the TIA 100.

The behavior G1 is the transfer curve for the comparable TIA without any cascade FET 21 in the amplifier section 21, where the drain of the FET 22 is directly connected to the load resistor 23. In this case, inputting the photocurrent $I_{OS}$ to such amplifier section 120, the level $V_A$ varies on the transfer curve G1. Because this transfer curve G1 shows the linear relation between the photocurrent $I_{OS}$ and the level $V_A$, the cross point of the eye diagram E1 is set to 50%, which directly reflects the eye diagram of the photocurrent E4.

The behavior G2 is the transfer curve corresponding to an arrangement where the amplifier section 120 only provides the cascade FET 21. The cascade FET 21 may operate to reduce the voltage gain thereof when the photocurrent $I_{OS}$ becomes large, the level $V_A$ saturates at a larger photocurrent $I_{OS}$, and the cross point in the eye diagram E2 shifts to the lower side.

When the power supply shifts to Vcc' from Vcc for the arrangement above, this increase of the power supply affects the eye diagram of the level $V_A$ in the side where the photocurrent $I_{OS}$ is smaller, which appears in the high level of the behavior E5. On the other hand, the low level of the behavior E2 is substantially unchanged from the behavior E1 where the power supply is set to be Vcc. That is, the cross point is substantially unchanged in the level thereof, while, the conversion gain at the cross point, which is the slope of the behavior E5 at the cross point, is enhanced. The reason why the conversion gain increases is that, the increase of the power supply 18 directly reflects the increase of the load current flowing in the resistor 23, but the FET 22 is forced to compensate the increase of the load current by setting the gate bias thereof slightly larger. Although the current from the current source 121 is a primary portion of the drain current of the FET 22, the increase of the load current is compensated by the FET 22 by setting the gate bias slightly higher, which results in the enhanced conversion gain the of FET 22.

Behavior G5 is the transfer curve when the power supply is set in Vcc'. Inputting the photocurrent with the eye diagram E4, the level $V_A$ of the node A changed on the curve G5. As described above, the higher side of the curve G5 is drawn from the point Vcc', while, the lower side thereof is substantially unchanged from the curve G2; accordingly, the eye diagram E5 enhances only the high level thereof compared with the eye diagram E2, which is equivalent to shift the cross point relative to that of the eye diagram E2. That is, the arrangement of the TIA 100 shifts the cross point of the output thereof as the power supply fluctuates.

The TIA 15 shown in FIG. 2, as described later, shifts the level $V_A$ of the node A following the variation of the power supply. When the power supply 18 is enhanced to Vcc', the transfer curve of the amplifier unit 20 of the TIA 15 becomes the behavior G3 in FIG. 4, which is substantially the parallel displacement of the transfer curve G2 by the difference ΔVcc between two power supplies, Vcc' and Vcc. Inputting the photocurrent IOS in the amplifier section 20 having the transfer curve G3, the eye diagram of the level $V_A$ becomes the behavior E3. That is, the eye diagram E3 is shifted in the levels thereof from the eye diagram E2 as maintaining the level of the cross point. The amplifier section 20, or the TIA 15 shown in FIG. 2, may suppress the variation of the cross point caused by the fluctuation of the power supply.

Figure 5:
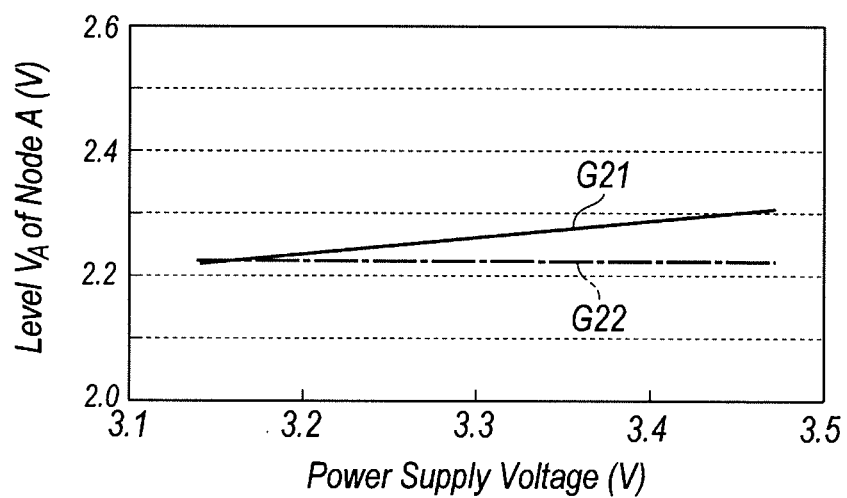
FIG. 5 shows behaviors of the node level $V_A$ against the power supply voltage Vcc.

The TIA 100 shown in FIG. 3 has the source follower 130 with the FET 33 for the current source whose gate is short-circuited to the source thereof; while, the source follower 30 according to the present embodiment has the FET 33 for the current source constituting the current-mirror circuit. This arrangement of the FET 33 may vary the level $V_A$ of the node A, which may effectively suppress the sift of the cross point. FIG. 5 shows the shift of the level $V_A$ against the power supply voltage Vcc. In FIG. 5, a behavior G21 corresponds to the TIA 15 of the present embodiment, while, another behavior G22 shows a result obtained by the comparable TIA 100. The behavior G22 is substantially independent on the power supply voltage Vcc, while, the behavior increases as the power supply voltage increases.

Figure 6:
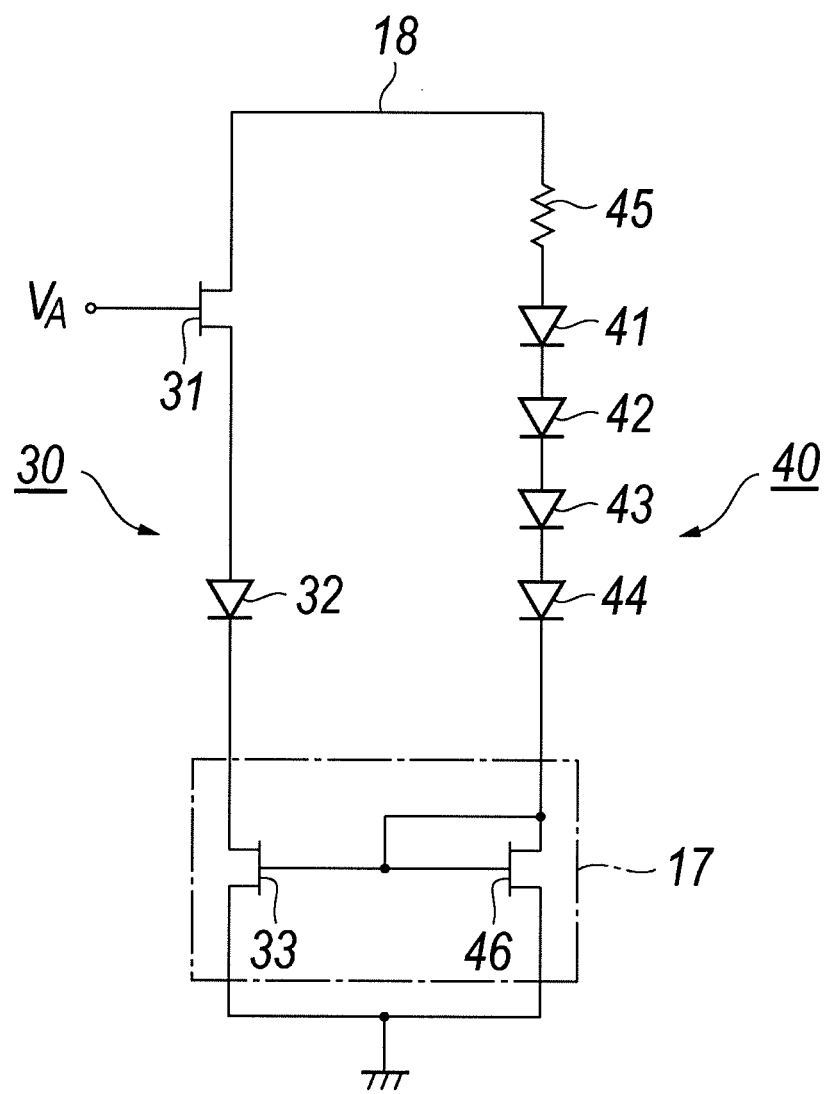
FIG. 6 extracts the source follower and the bias generator of the TIA of the embodiment, where a portion of the source follower and a portion of the bias generator constitute a current mirror circuit.

FIG. 6 extracts the current mirror circuit 17 from the source follower 30 and the bias generator 40 of the present embodiment. The current mirror circuit 17 reflects the current determined by the bias generator 40, specifically, by the series circuit of the resistor 45, four diodes, 41 to 44, and the FET 17, directly to the current flowing in the source follower 30.

Figure 7:
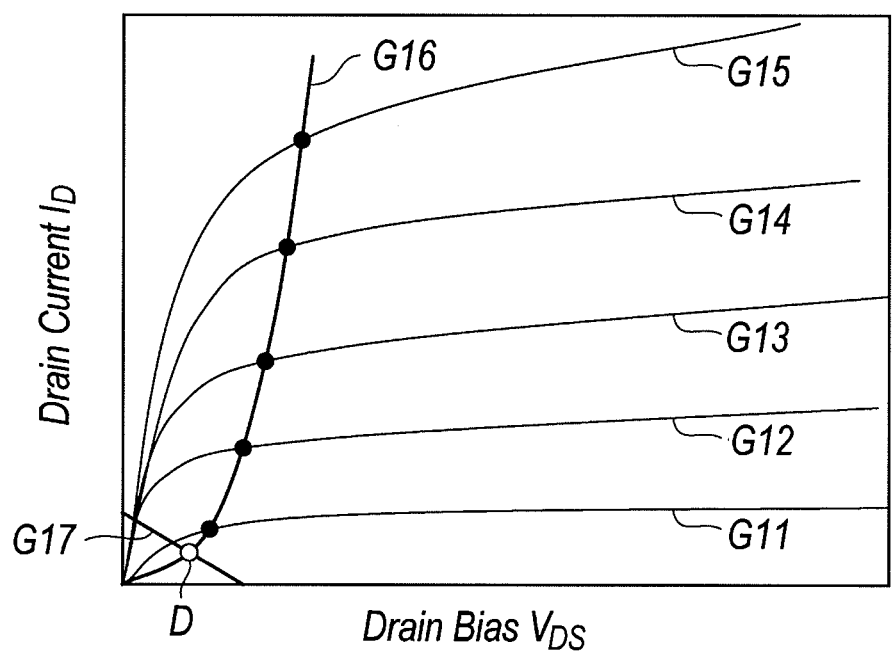
FIG. 7 shows a static characteristic and an operating point of the transistor in the current mirror circuit.
Figure 8A:
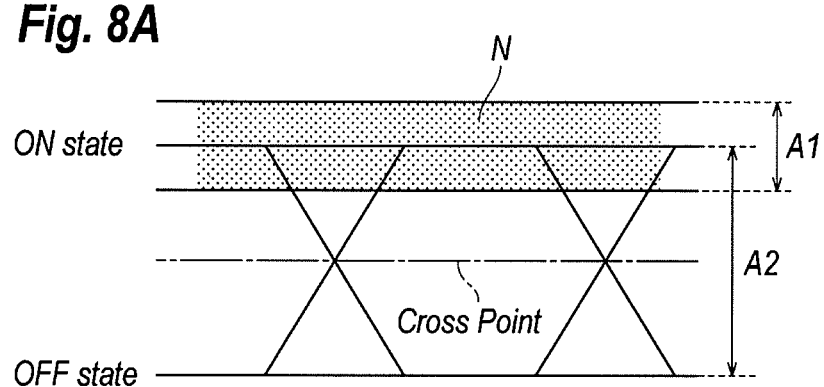
FIG. 8A is a typical eye diagram of the optical signal input to the TIA.
Figure 8B:
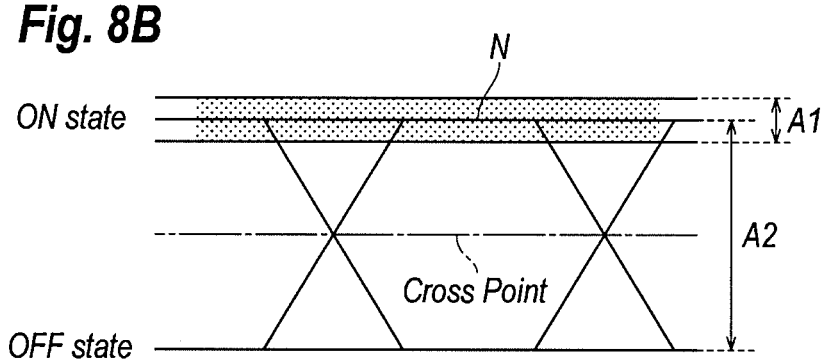
FIG. 8B is an eye diagram output from the TIA with variable gain/trans-impedance function.

FIG. 7 shows a static characteristic of the drain current $I_D$ against the bias $V_{DS}$ between the drain and the source of a general purpose FET for the gate biases $V_{GS}$ as the parameter. Behaviors, G11 to G15, corresponds to the drain current for respective gate biases $V_{GS}$, where G11 corresponds to the deepest bias, while G15 reflects the shallowest bias condition.

Because the gate of the FET 46 in the bias generator 40 is short-circuited to the drain thereof, the drain bias $V_{DS}$ is identical with the gate bias $V_{GS}$ in FET 46. Accordingly, behavior G16 in FIG. 7, which connects points where the drain bias $V_{DS}$ is equal to the gate bias $V_{GS}$, becomes the operating curve of the FET 46. the behavior G16 is similar to the static characteristic of a diode but it does not show the exponential performance, in particular, a substantial current appears in a region where the drain bias $V_{DS}$ is small.

Moreover, when the significant current flows in the bias generator 40, the forward voltage of the diodes, 41 to 44, saturates around 0.75V, which means that the four diodes connected in series may be regarded as a battery with a voltage of about 3.0V. When the power supply of the circuit is set to be 3.3V, which is very popular in recent electronic apparatus, the bias generator is equivalent to a circuit where the FET 46 and the resistor 45 are connected in series between a power supply of 0.3V and the ground. In this case, the operating point of the FET 46 is determined by a point D where the behavior G16 crosses the load line G17 of the resistor 45 drawn from the equivalent power supply of 0.3V. Thus, the variation of the power supply directly reflects in the series circuit of the resistor, the diodes, and the FET in the bias generator. Specifically, the series circuit of the resistor 45 and the FET 46 is biased by a voltage of Vcc−0.75V×n, where n is the number of the diode, and the operating point D of the series circuit above may shift tracing the variation of the power supply Vcc.

Thus, the TIA 15 of the present embodiment may stabilize the cross point of the output thereof even when the power supply varies because the level $V_A$ of the node A traces the change of the power supply.

The load resistor 45 has resistance substantially equal to resistance of the operating curve G16 of the FET 46 at the operating point D. Under such a condition, the variation of the power supply is reflected in the shift of the operating point D by the same amount, the one-to-one relation. When the FET 46 is operated in a region where the operating curve shows a steep characteristic, the variation of the power supply may be excessively reflected in the current flowing in the source follower 30, while, when the FET 46 is operated in a region where the operating curve has a dull characteristic, the variation of the power supply is not substantially reflected in the change of the current in the source follower 30.

While several embodiments and variations of the present invention are described in detail herein, it should be apparent that the disclosure and teachings of the present invention suggest many alternative designs to those skilled in the art. For instance, the count of diodes in the bias generator is not restricted to four, but it may be determined depending on the power supply. Therefore, it is intended that the present invention not be limited to the particular embodiments disclosed, but that the invention include all embodiments falling within the scope of the appended claims.

What is claimed is:

1. A trans-impedance amplifier, comprising:
an amplifier section;
a source follower for receiving an output of the amplifier section, the source follower including a first transistor to define a current flowing in the source follower; and
a bias generator including a second transistor, a load resistor, and a plurality of diodes, the second transistor being arranged in a diode connection, the second transistor, the diodes and the load resistor being connected in series between a power supply and a ground, the first transistor and the second transistor constituting a current mirror circuit to determine the current flowing in the source follower,
wherein the output of the amplifier section varies in a level thereof depending on a variation of the power supply.

2. The trans-impedance amplifier of claim 1,
wherein the second transistor has resistance between two current electrodes thereof substantially equal to resistance of the load resistor.

3. The A trans-impedance amplifier, comprising:
an amplifier section;
a source follower for receiving an output of the amplifier section, the source follower including a first transistor to define a current flowing in the source follower; and
a bias generator including a second transistor arranged in a diode connection and a load resistor connected in series to the second transistor between a power supply and a ground, the first transistor and the second transistor constituting a current mirror circuit to determine the current flowing in the source follower, the second transistor having resistance between two current electrodes thereof substantially equal to resistance of the load resistor,
wherein the output of the amplifier section varies in a level thereof depending on a variation of the power supply.

* * * * *